US012721111B2

(12) United States Patent
Bieli et al.

(10) Patent No.: US 12,721,111 B2
(45) Date of Patent: Aug. 25, 2026

(54) MINI ENVIRONMENT INSTRUMENTED WAFER

(71) Applicant: KLA Corporation, Milpitas, CA (US)

(72) Inventors: Giampietro Bieli, Santa Clara, CA (US); Andy Wijaya, Milpitas, CA (US); Mor Azaria, Migdal Ha'emek (IL); Tsahi Muyal, Milpitas, CA (US); Izhar Agam, Milpitas, CA (US); Adi Pahima, Migdal Ha'emek (IL); Yoram Uziel, Yodfat (IL)

(73) Assignee: KLA Corporation, Milpitas, CA (US)

( * ) Notice: Subject to any disclaimer, the term of this patent is extended or adjusted under 35 U.S.C. 154(b) by 0 days.

(21) Appl. No.: 18/750,894

(22) Filed: Jun. 21, 2024

(65) Prior Publication Data

US 2025/0014950 A1 Jan. 9, 2025

Related U.S. Application Data

(60) Provisional application No. 63/524,701, filed on Jul. 3, 2023.

(51) Int. Cl.
*H01L 21/66* (2006.01)
*G01F 1/86* (2006.01)

(52) U.S. Cl.
CPC ................ *H01L 22/30* (2013.01); *G01F 1/86* (2013.01)

(58) Field of Classification Search
CPC .................................. H01L 22/30; G01F 1/86
See application file for complete search history.

(56) References Cited

U.S. PATENT DOCUMENTS

| | | | |
|---|---|---|---|
| 5,444,637 | A | 8/1995 | Smesny et al. |
| 6,140,833 | A | 10/2000 | Flietner et al. |
| 7,233,874 | B2 | 6/2007 | Ye et al. |
| 7,299,148 | B2 | 11/2007 | Hunt et al. |
| 7,698,952 | B2 | 4/2010 | Renken et al. |
| 7,757,574 | B2 | 7/2010 | Renken et al. |
| 8,104,342 | B2 | 1/2012 | Sun et al. |

(Continued)

FOREIGN PATENT DOCUMENTS

| | | | |
|---|---|---|---|
| CN | 111771273 | A | 10/2020 |
| CN | 112219272 | B | 12/2021 |

(Continued)

OTHER PUBLICATIONS

Korean Intellectual Property Office, International Search Report and Written Opinion received in International Application No. PCT/US2024/035490, Oct. 17, 2024, 7 pages.

*Primary Examiner* — Fernando L Toledo
*Assistant Examiner* — Marshall Mu-Nuo Hatfield
(74) *Attorney, Agent, or Firm* — Suiter Swantz IP

(57) ABSTRACT

A system and method for measuring substrate processing conditions are disclosed. The system may include an instrumented substrate including a substrate body. The instrumented substrate may include one or more sensors configured to measure one or more conditions of the at least one of the substrate body or of an external environment proximate to a surface of the substrate body. The substrate body may include channels within the substrate body connected to the one or more sensors. Each channel may include an open channel configured to allow a flow of gas through the open channel.

27 Claims, 6 Drawing Sheets

(56) References Cited

U.S. PATENT DOCUMENTS

| | | | | |
|---|---|---|---|---|
| 9,134,186 | B2 | 9/2015 | Sun et al. | |
| 10,509,052 | B2 | 12/2019 | Thaulad et al. | |
| 10,777,393 | B2 | 9/2020 | Jensen et al. | |
| 10,818,561 | B2 | 10/2020 | Tedeschi et al. | |
| 11,569,138 | B2 | 1/2023 | Azarya et al. | |
| 2005/0246127 | A1 | 11/2005 | Renken et al. | |
| 2015/0253375 | A1* | 9/2015 | Meinhold | B81B 7/02 324/762.01 |
| 2019/0301912 | A1 | 10/2019 | Miyoshi et al. | |
| 2020/0083072 | A1* | 3/2020 | Quli | H05K 1/181 |
| 2021/0101249 | A1 | 4/2021 | Chen | |
| 2022/0307919 | A1* | 9/2022 | Urakawa | G01K 11/32 |
| 2023/0119169 | A1 | 4/2023 | Azarya et al. | |
| 2023/0393192 | A1* | 12/2023 | van Soestbergen | G01R 31/2889 |
| 2024/0274401 | A1 | 8/2024 | Bella et al. | |

FOREIGN PATENT DOCUMENTS

| | | | | | |
|---|---|---|---|---|---|
| DE | 10314150 | A1 | | 10/2004 | |
| JP | 2007187619 | A | | 7/2007 | |
| JP | 2008517466 | A | | 5/2008 | |
| KR | 2019003274 | A | * | 1/2019 | A46B 13/02 |

* cited by examiner

322
CONTROLLER
324
MEMORY
326
PROCESSOR
302
304
306
308
310
110
314
312
300
100
320

MINI ENVIRONMENT INSTRUMENTED WAFER

CROSS-REFERENCE TO RELATED APPLICATION

The present application claims the benefit under 35 U.S.C. § 119(e) of U.S. Provisional Application Ser. No. 63/524,701, filed Jul. 3, 2023, entitled MINI ENVIRONMENT (ME) TEST WAFER, naming Giampietro Bieli, Andy Wijaya, Mor Azaria, Tsahi Muyal, Izhar Agam, Adi Pahima, and Yoram Uziel as inventors, which is incorporated herein by reference in the entirety.

TECHNICAL FIELD

The present disclosure relates generally to semiconductor substrates, and, more particularly, to a system and method for characterizing conditions experienced by a substrate.

BACKGROUND

Substrates such as wafers may undergo processing in one or more chambers. An orchestra of hardware such as air blowers, air filters, substrate moving stages, flow orienting panels, ducts, tubes and the like may be used to process the substrate and keep the substrate under ideal operating conditions.

The demand for ultra-clean equipment performance is increasing every generation of semiconductor manufacturing. Wafers, reticles, and flat panels are being transferred in relatively risk-prone locations during their loading onto a tool. Starting with atmospheric conditions, substrates in some tools may pass through a load lock chamber with relatively aggressive changing conditions.

It may not be necessarily apparent what is causing a particular condition (e.g., low yields, high contamination) when using a setup having many components and processing steps. Accordingly, sensors are typically placed within a chamber to measure conditions such as air flow velocity and air pressure. These sensors measure the environment as the substrate is moved from a storage location to one or more tool components for processing. However, even these sensors may not fully capture the conditions that a wafer experiences when being processed.

There may be a desire for a system or method that may more effectively characterize conditions experienced by a substrate during processing.

SUMMARY

An instrumented substrate is disclosed in accordance with one or more illustrative embodiments of the present disclosure. In one illustrative embodiment, the instrumented substrate may include a substrate body. In another illustrative embodiment, the instrumented substrate may include one or more sensors coupled to the substrate body and configured to measure one or more conditions of at least one of the substrate body or of an external environment proximate to a surface of the substrate body. In another illustrative embodiment, the instrumented substrate may include a controller communicatively coupled to the one or more sensors and configured to measure sensor data from the one or more sensors indicative of the measured one or more conditions and transmit the sensor data indicative of the one or more conditions to a controller of the semiconductor process tool. In another illustrative embodiment, the substrate body may include one or more sets of a plurality of channels within the substrate body. In another illustrative embodiment, a first sensor of the one or more sensors may be connected to a first set of channels of the one or more sets of the plurality of channels. In another illustrative embodiment, each channel of the first set of channels may include an open channel configured to allow a flow of gas through the open channel. In another illustrative embodiment, each channel of the first set of channels may be coupled to an opening defined by the surface of the substrate body and fluidically connected to the external environment proximate to the surface of the substrate body.

In a further aspect, at least three of the first set of channels may be non-parallel to each other. In another aspect, the one or more sensors may be located inside the substrate body. In another aspect, the instrumented substrate may include a second sensor. In another aspect, the second sensor may include at least one of an air velocity sensor or an air pressure sensor. In another aspect, the first sensor may include an air pressure sensor. In another aspect, the substrate body may include an enclosed pressure reference reservoir coupled to the air pressure sensor. In another aspect, the first sensor may include an air velocity sensor.

A system is disclosed in accordance with one or more illustrative embodiments of the present disclosure. In one illustrative embodiment, the system may include a semiconductor process tool and an instrumented substrate. In another illustrative embodiment, the instrumented substrate may include a substrate body, one or more sensors coupled to the substrate body and configured to measure one or more conditions of at least one of the substrate body or of an external environment proximate to a surface of the substrate body, and a controller communicatively coupled to the one or more sensors. In another illustrative embodiment, the controller may be configured to measure sensor data from the one or more sensors indicative of the measured one or more conditions and transmit the sensor data indicative of the one or more conditions to a controller of the semiconductor process tool. In another illustrative embodiment, the substrate body may include one or more sets of a plurality of channels within the substrate body. In another illustrative embodiment, a first sensor of the one or more sensors may be connected to a first set of channels of the one or more sets of the plurality of channels. In another illustrative embodiment, each channel of the first set of channels may include an open channel configured to allow a flow of gas through the open channel. In another illustrative embodiment, each channel of the first set of channels may be coupled to an opening defined by the surface of the substrate body and fluidically connected to the external environment proximate to the surface of the substrate body.

In a further aspect, at least three of the first set of channels may be non-parallel to each other. In another aspect, the one or more sensors may be located inside the substrate body. In another aspect, the system may include a second sensor. In another aspect, the second sensor may include at least one of an air velocity sensor or an air pressure sensor. In another aspect, the first sensor may include an air pressure sensor. In another aspect, the substrate body may include an enclosed pressure reference reservoir coupled to the air pressure sensor. In another aspect, the first sensor may include an air velocity sensor. In another aspect, a controller of the semiconductor process tool may be configured to perform substrate-processing operations configured to simulate at least some aspects of production substrate processing operations but the substrate-processing operations may exclude permanently adding additional layers to the instrumented substrate via deposition and etching operations. In another aspect, a controller of the semiconductor process tool may be configured to adjust a process condition based on the sensor data.

A method for measuring substrate processing conditions is disclosed in accordance with one or more illustrative embodiments of the present disclosure. In one illustrative embodiment, the method may include positioning an instrumented wafer within a semiconductor process tool. In another illustrative embodiment, the method may include measuring, with one or more sensors, one or more conditions of at least one of a substrate body of an instrumented wafer or an external environment proximate to a surface of the substrate body. In another illustrative embodiment, the one or more sensors may be coupled to the substrate body. In another illustrative embodiment, the method may include transmitting the sensor data indicative of the one or more conditions to a controller of the semiconductor process tool. In another illustrative embodiment, the substrate body may include one or more sets of a plurality of channels within the substrate body. In another illustrative embodiment, a first sensor of the one or more sensors may be connected to a first set of channels of the one or more sets of the plurality of channels. In another illustrative embodiment, each channel of the one or more sets of the plurality of channels may include an open channel configured to allow a flow of gas through the open channel. In another illustrative embodiment, each channel of the first set of channels may be coupled to an opening defined by the surface of the substrate body and fluidically connected to the external environment proximate to the surface of the substrate body.

In a further aspect, the method may include activating substrate-processing operations configured to simulate at least some aspects of production substrate-processing operations but excluding permanently adding additional layers to the instrumented substrate via deposition and etching operations. In another aspect, the substrate-processing operations may include allowing a flow of gas through an open channel of the instrumented substrate. In another aspect, at least three of the first set of channels may be non-parallel to each other. In another aspect, the one or more sensors may be located inside the substrate body. In another aspect, the instrumented substrate may include a second sensor. In another aspect, the second sensor may include at least one of an air velocity sensor or an air pressure sensor. In another aspect, the first sensor may include an air pressure sensor. In another aspect, the instrumented substrate may include an accelerometer. In another aspect, the method may include adjusting a process condition based on the sensor data.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures.

DETAILED DESCRIPTION

Figure 1:
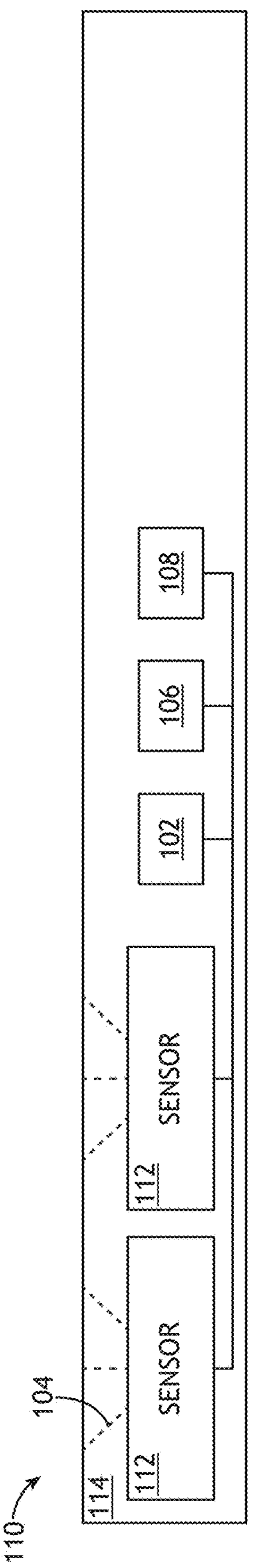
FIG. 1 illustrates a block diagram of an instrumented substrate, in accordance with one or more embodiments of the present disclosure.

The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure. Reference will now be made in detail to the subject matter disclosed, which is illustrated in the accompanying drawings.

Semiconductor wafers are typically fabricated using a variety of steps that iteratively build up the wafers, layer by layer. These steps are typically sensitive to processing conditions.

Optimization of wafer processing is typically done using a relatively long process of measuring with different flow and pressure gauge heads at specific points in the tool. Such methods may suffer from lack of ability to measure the conditions present at the wafer surface. When the wafer is moved from its storage location onto a chuck of a tool, it is typically subjected to dynamically changing environments. It is unclear where the highest risk points are located. It may also be difficult to measure conditions experienced by the wafer during motion of the wafer because it may be impractical to fix the sensors near rapid moving large assemblies.

Referring to FIGS. 1 through 6, systems and methods for measuring substrate processing conditions are disclosed, in accordance with one or more embodiments of the present disclosure.

Embodiments of the present disclosure are directed to the utilization of an instrumented substrate equipped with sensors. In embodiments, air pressure, air velocity, acceleration, humidity, vibration, UV light, and/or the like may be measured using sensors embedded inside the instrumented substrate. The instrumented wafer may be configured to experience some, but not necessarily all, of the processes used for processing a production wafer. For example, the tool may be configured to move the instrumented wafer to processing locations within each chamber and activate components within the tool to simulate processing of a production wafer. In this way, the instrumented substrate may measure conditions that a wafer experiences when being processed. In embodiments, the instrumented substrate may include multiple channels which originate at the surface of the substrate and are connected to a single corresponding sensor. The channels may enable fluidic communication at multiple points on the instrumented substrate, with all of those points for a particular parameter measured by a single sensor. For example, air pressure and air velocity sensors may be coupled to two sets of channels in the instrumented substrate. Multiple sensors in a single substrate and/or a catalog of substrates may be used for testing for a variety of measurements. Such an approach may be better at fully characterizing conditions that a wafer experiences compared to other measurement methods, such as fixed sensors coupled to the chamber walls. It is contemplated that conditions inside a chamber may be adjusted based on the data from one or more instrumented substrates. Embodiments of the present disclosure may enable more accurate contamination risk assessment during the substrate journey throughout the semiconductor process tool.

Adjustments to the semiconductor process tool may improve processing, such as improving yields of fabricated wafers. Specifically, for example, benefits may include improved optimization adjustment opportunities configured to reduce particulate and molecular contamination from reaching the wafer surfaces.

In embodiments, the instrumented substrate is not fixed to a single location, but rather may be configured to traverse through one or more portions of the semiconductor process tool in the same manner and path as a production wafer. Additional embodiments of the present disclosure may be configured to correlate the sensor data received from the instrumented substrate to the location of the instrumented substrate within the semiconductor process tool based on a time stamp of when such sensor data was recorded.

FIG. 1 illustrates a block diagram of an instrumented substrate 110, in accordance with one or more embodiments of the present disclosure.

In embodiments, the instrumented substrate 110 may include a substrate body 114, a controller 102, a power source 106, a communication interface 108, and/or one or more sensors 112. For the purposes of the present disclosure, the instrumented substrate 110 may also be referred to as an instrumented substrate assembly, substrate device, instrumented wafer, instrumented wafer substrate, sensor wafer, test wafer, substrate monitoring device, instrumented substrate device, measurement wafer, and the like.

In embodiments, the instrumented substrate 110 may be configured for measuring substrate processing conditions. For example, the instrumented substrate 110 may be used as a test substrate or instrumented substrate to collect data of the conditions experienced by actual wafers during processing. For example, the instrumented substrate 110 may include a power source 106, such as a battery, enabling the instrumented substrate 110 to be mobile and therefore be handed off, from one station to the next.

The instrumented substrate 110 may be any shape, such as a shape suitable for use in a semiconductor process tool. For instance, the instrumented substrate 110 may be shaped like a wafer. For instance, the instrumented substrate 110 may be shaped like a round flat disc.

In embodiments, the instrumented substrate 110 includes a substrate body 114, or body 114. The body 114 may include a housing. For example, the body 114 may include, but is not limited to, silicon material. The body 114 may take on a structure similar to that of a wafer, reticle, flat panel, or electric board.

In embodiments, the instrumented substrate 110 includes one or more sensors 112. The one or more sensors 112 may be coupled to the body 114. For instance, the sensors 112 may be embedded/enclosed within the body 114.

The one or more sensors 112 may include any sensor known in the art. For example, the one or more sensors may be configured to measure one or more conditions (e.g., air pressure, air velocity, etc.) of at least one of the substrate body 114 or of an external environment proximate to a surface of the substrate body. For example, air pressure and air velocity may be a condition of the external environment, and acceleration may be a condition of the substrate body. The one or more conditions may correspond to sensor data measurable using the one or more sensors 112. The instrumented substrate 110 may include sensors 112 for air pressure, air velocity, acceleration, humidity, vibration, ultraviolet light, and/or the like. For example, the instrumented substrate 110 may include an air pressure sensor. For example, the instrumented substrate 110 may include an air velocity sensor. For example, the instrumented substrate 110 may include an accelerometer. For example, the instrumented substrate 110 may include a vibration sensor. For example, the instrumented substrate 110 may include a humidity sensor. For example, the instrumented substrate 110 may include a UV light sensor. For instance, a third sensor (not shown) may be coupled to a third set of channels 104.

In embodiments, the body 114 includes one or more channels 104. The one or more sensors 112 may be disposed within the body 114 and coupled to the one or more channels 104. For example, the one or more channels 104 may allow the one or more sensors 112 to measure conditions such as air pressure and/or air velocity near a surface of the body 114. In this regard, the environmental conditions present just above the surface may be measured using one or more sensors 112 within the one or more channels 104.

The instrumented substrate 110 may include one or more controllers 102. In embodiments, the system 100 includes a controller 102 communicatively coupled to the sensors 112. For example, the controller 102 may be located on the instrumented substrate 110, such as inside the body 114. The controller 102 may provide data collection and data storage functionality to the instrumented substrate 110.

The power source 106 may include one or more batteries, a wired power source, or the like. The power source 106 may provide power to any of the various components of the instrumented substrate 110. The power source 106 may be embedded into the body 114. The power source 106 may provide power storage functionality to the instrumented substrate 110.

The communication interface 108 may include any wireline communication protocol (e.g., DSL-based interconnection, cable-based interconnection, T9-based interconnection, USB, and the like) or wireless communication protocol (e.g., GSM, GPRS, CDMA, EV-DO, EDGE, WiMAX, 3G, 4G, 4G LTE, 5G, Wi-Fi protocols, RF, Bluetooth, Intermediate System to Intermediate System (IS-IS), and the like). By way of another example, the communication interface 108 may include communication protocols including, but not limited to, radio frequency identification (RFID) protocols, open-sourced radio frequencies, and the like. By way of another example, the communication interface 108 may include inductive wireless communications and/or inductive wireless charging. For instance, the communication interface 108 may use On-Off keying and backscatter modulation for bidirectional data transfer together with inductive power transfer for battery charging. Accordingly, an interaction between the various devices may be determined based on one or more characteristics including, but not limited to, cellular signatures, IP addresses, MAC addresses, Bluetooth signatures, radio frequency identification (RFID) tags, and the like.

Figure 2:
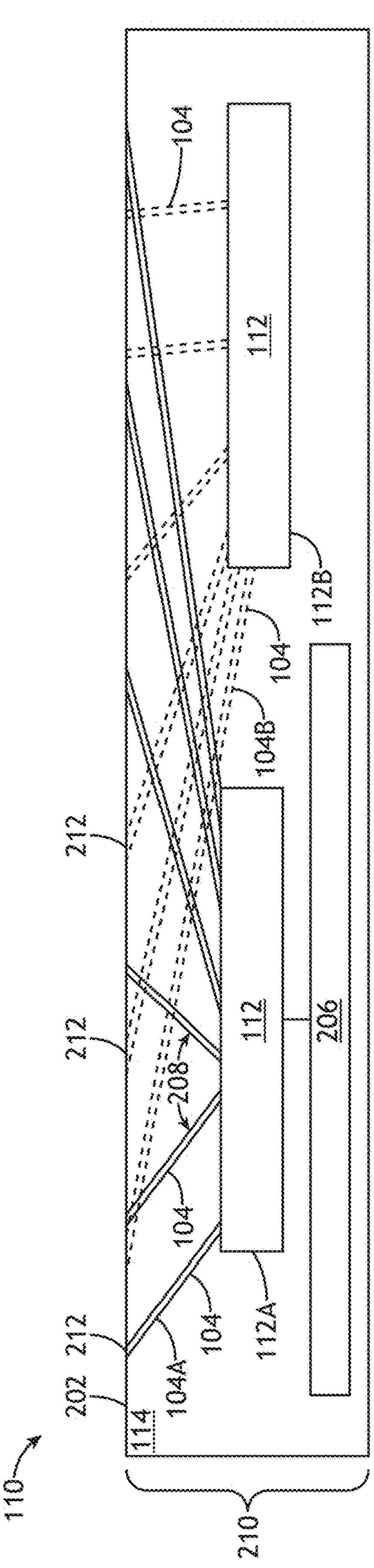
FIG. 2 illustrates a schematic view of an instrumented substrate including a plurality of channels coupled between sensors and openings on a surface of the instrumented substrate, in accordance with one or more embodiments of the present disclosure.

FIG. 2 illustrates a schematic view of an instrumented substrate 110 including a plurality of channels 104 coupled between sensors 112 and openings 212 on a surface 202 of the instrumented substrate 110, in accordance with one or more embodiments of the present disclosure.

The body 114 may include channels 104 coupled to one or more of the sensors 112. For example, a first sensor 112A may be coupled to a first set of channels 104A. In this way, the first sensor 112A of the one or more sensors 112 may be connected to a first set of channels 104A of one or more sets of channels 104. For instance, the substrate body 114 may include (or define) one or more sets of channels 104 within the substrate body 114. For example, the channels 104 may be holes, cavities, or the like defined by inner surfaces of the substrate body 114. The one or more channels 104 may include, but are not limited to, inserted or embedded tubes, drilled holes, and/or the like.

Each channel 104 may be an "open" channel configured to allow a flow of gas through the open channel. For example, the channels 104 may be empty to allow air pressure and/or air velocity readings to be measured by sensors 112. Each channel 104 of any set of channels may be coupled to an opening 212 defined by a surface 202 of the substrate body 114 and thereby be in fluidic communication with an external environment proximate to the surface 202. In this way, a sensor 112 may more fully characterize the environment near the surface 202 of the substrate body 114.

In embodiments, the channels 104 may be straight. For example, each channel 104 may be along a straight axis/line.

Angles 208 between channels 104 of a set corresponding to a particular sensor 112 may be non-parallel. For example, at least three of the first set of channels 104A may be at non-parallel angles 208 relative to each other. This may allow a single sensor 112 to test readings at multiple openings 212 on the surface 202.

Each channel 104 may be used for a separate reading (e.g., pressure reading), but measured by a respective port of a single sensor 112. For example, the sensor 112 may include individual ports coupled to each respective channel 104. In this way, one sensor 112 may be used per parameter. For example, each sensor 112 may be coupled to ten to twenty channels 104 and respective openings 212.

The surface 202 may include any surface of the substrate body 114. For example, the surface 202 may be outer surfaces to measure external environments proximate to the substrate body 114. For example, the surface 202 may include a top surface as shown. For example, the surface 202 may include a bottom surface. The surface 202 may include at least one of a top surface or a bottom surface. The surface 202 may include both a top surface and a bottom surface.

The sensors 112 may measure conditions at any frequency. For example, the sensors 112 may measure conditions between 10 and 50 Hz.

The sensors 112 may be located inside the substrate body 114, such as being inside cavities and enclosed within the substrate body 114.

For example, the first sensor 112A may include (or be) an air pressure sensor configured to measure air pressure from one or more openings 212. For example, the first sensor 112A may be an air velocity sensor configured to measure air velocity from one or more openings 212.

Any sensor such as a second sensor 112B different from the first sensor 112A may be an air velocity sensor configured to measure air velocity from one or more openings 212. The second sensor may be coupled to different (second) channels 104B.

The air pressure sensor (e.g., first sensor 112A) may be coupled to an enclosed pressure reference reservoir 206. The enclosed pressure reference reservoir 206 may be configured to provide a reference pressure for a differential pressure reading. For example, the reference pressure may be used for calibration. The pressure reference reservoir 206 may include a cavity enclosed by the substrate body 114.

In embodiments, both an air pressure sensor 112 and an air velocity sensor 112 may be used. For example, as shown in FIG. 2, the channels 104 corresponding to two different sensors may be crossing when viewed from the side but not necessarily intersecting. In this way, each sensor 112 may capture sensor data near the entire surface 202 using the channels 104.

The instrumented substrate 110 may have an overall thickness 210. In embodiments, the overall thickness 210 of the instrumented substrate 110 is between 0.1 and 20 millimeters thick. In embodiments, the overall thickness 210 of the instrumented substrate 110 is between 1 and 5 millimeters thick.

Figure 3:
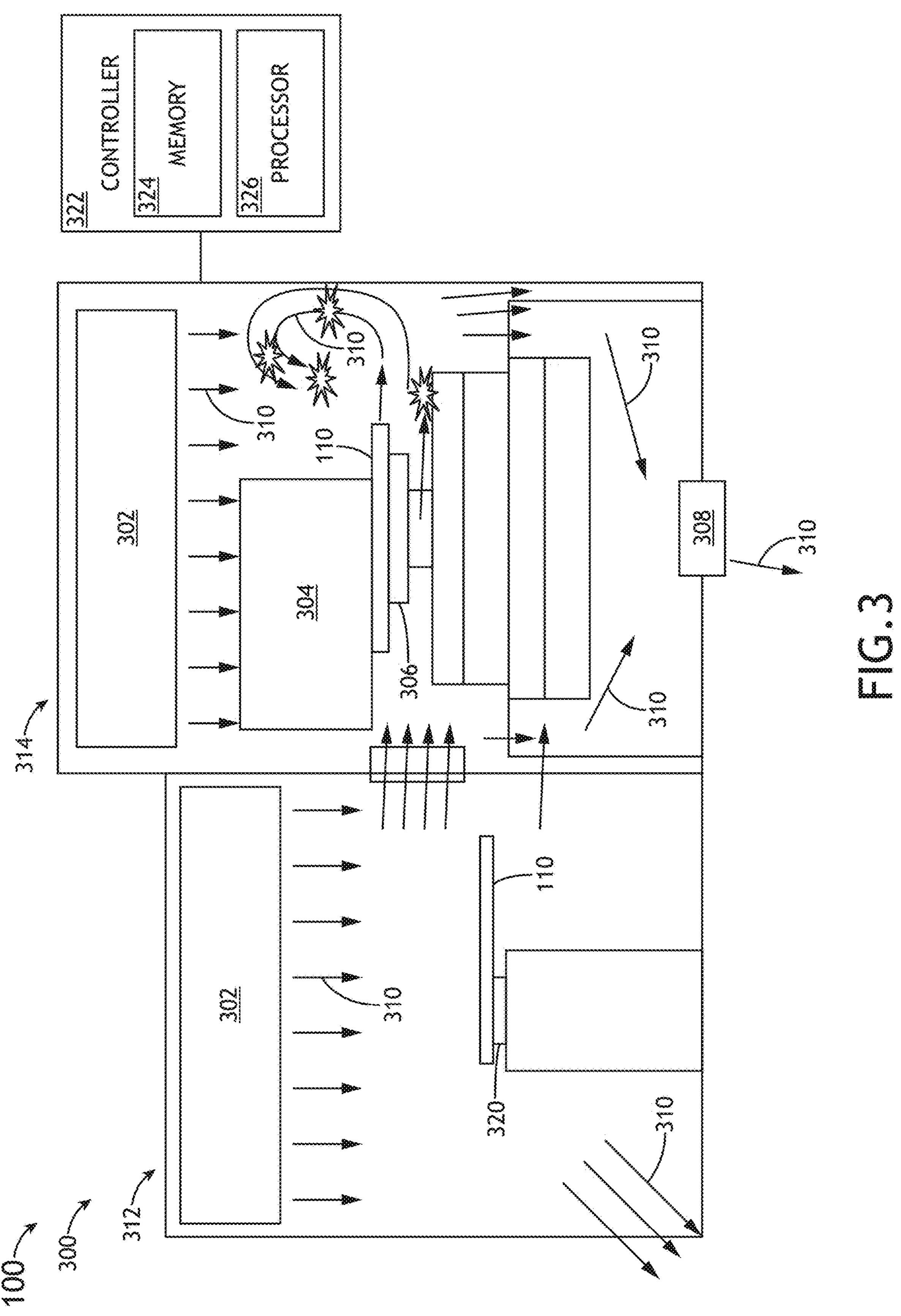
FIG. 3 illustrates a schematic view of an instrumented substrate in a controlled processing environment, in accordance with one or more embodiments of the present disclosure.

FIG. 3 illustrates a schematic view of an instrumented substrate 110 in a semiconductor process tool 300, in accordance with one or more embodiments of the present disclosure.

The tool 300 may include a controller 322. The controller 322 may include one or more processors 326 and a memory device 324, or memory. For example, the one or more processors 326 may be configured to execute a set of program instructions maintained in the memory 324. For example, the program instructions may be configured to cause the controller 322 to be configured to measure the sensor data from the sensors 112 and/or transmit one or more signals (e.g., signals comprising the sensor data) to an external device (e.g., controller 322) indicative of the measured conditions. The controllers 102, 322 may be located anywhere and communicate with each other wirelessly or via wired communication. For example, the controller 102 may be located in the instrumented substrate 110 and the controller 322 may be located externally for additional processing of sensor data. For example, the controller 322 may be located on the semiconductor process tool 300.

In embodiments, the semiconductor process tool 300, or tool 300, may include a controlled processing environment, such as one or more chambers 312, 314 with controlled conditions. In embodiments, the system 100 may include the tool 300. For example, the tool 300 may be configured to perform one or more operations configured to simulate a processing of a substrate, and to work in tandem with the instrumented substrate 110 to gather sensor data during those operations. For instance, the tool 300 may be configured to perform pseudo-substrate processing operations to the instrumented substrate 110, where deposition and etching (and other structural modifications) are not carried out but other steps are carried out to gather at least some sensor data of conditions experienced by the instrumented substrate 110. The pseudo-substrate processing operations may be configured to simulate at least some aspects of production substrate processing operations but where the pseudo-substrate processing operations exclude permanently adding additional layers to the instrumented substrate 110 via deposition and etching operations. For example, the tool 300 may be configured to move the instrumented substrate 110 between locations in each chamber 312, 314. For instance, the locations may include a storage location and at least one location below a deposition or etching component 304. The storage location may include, for example, a location where a wafer is stored before being moved by a substrate handler 320. Other locations, additionally or alternatively, may include a cleaning location where a substrate is configured to be cleaned. Another location, additionally or alternatively, may include a chuck location, where the instrumented substrate 110 is moved and mounted onto a chuck 306. For instance, a substrate handler 320 may be configured by a controller 322 of the tool 300 to move the instrumented substrate 110 onto the chuck 306. Activatable components 302 such as air pumps and the like may be configured to be concurrently activated.

Activatable components may include, but are not limited to, air blowers, air filters, substrate moving stages, flow orienting panels, adjustable ducts, tubes, and/or the like.

In embodiments, one or more components are configured to generate and/or regulate the airflow 310. For example, the airflow 310 may be used to closely control conditions inside the chambers 312, 314. For instance, parameters such as how many particulates are in the airflow 310, how much humidity is in the airflow 310, and the like may be controlled by components 302.

In embodiments, the controller 322 of the tool 300 may be configured to adjust a process condition based on the sensor data. For example, such parameters of the activatable components 302 may be adjusted. For example, the humidity may be adjusted.

The tool 300 may be any semiconductor process tool suitable for any purpose related to substrates, although is not necessarily limited to such purposes. For example, the tool 300 may include one or more chambers 312, 314. The tool 300 may be configured for one or more processing steps of substrates, such as cleaning, inspecting, depositing layers, etching, and/or the like.

The tool may include an air outlet 308 configured to remove air from a chamber 314. For instance, the air outlet 308 may include a vacuum pump.

Figure 4:
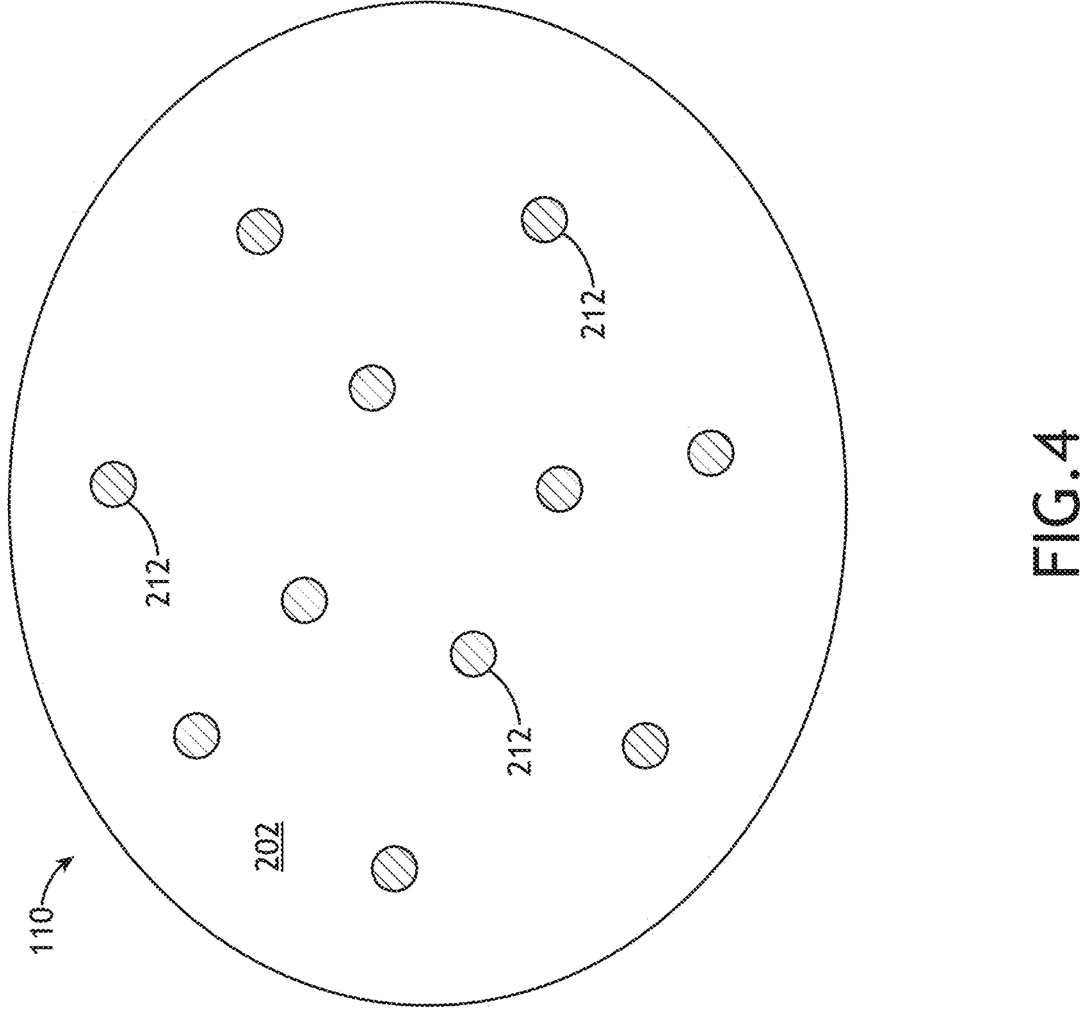
FIG. 4 illustrates a top-down view of an instrumented substrate including openings, in accordance with one or more embodiments of the present disclosure.

FIG. 4 illustrates a top-down view of an instrumented substrate 110 including the openings 212, in accordance with one or more embodiments of the present disclosure.

Openings 212 from a single sensor 112 or more than one sensor may span more than one axis of the surface 202 to capture sensor data across more than one dimension. For example, the openings 212 may span two orthogonal axes, which may be referred to as an X direction and a Y direction.

Figure 5:
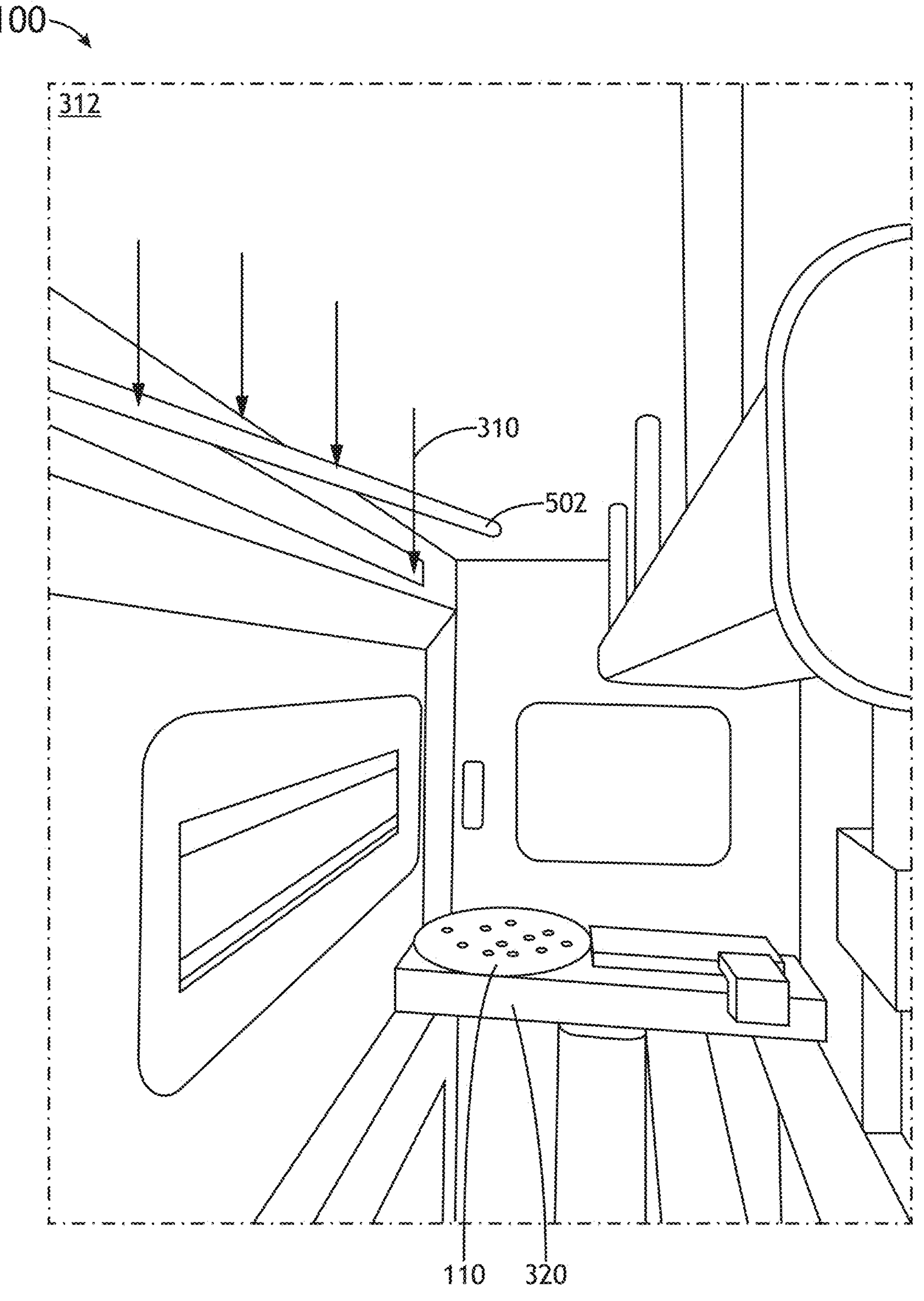
FIG. 5 illustrates a three-dimensional view inside a chamber including a fixed sensor spaced away from the instrumented substrate, in accordance with one or more embodiments of the present disclosure.

FIG. 5 illustrates a three-dimensional view inside a chamber 312 including a fixed sensor 502 spaced away from the instrumented substrate 110, in accordance with one or more embodiments of the present disclosure.

Note that the fixed sensor 502 is spaced relatively far away from the instrumented substrate 110. A wafer surface may be exposed to different air flow, pressure, turbulences than such fixed sensors 502. The spacing may correspond to differences in readings. The fixed sensor data alone may be insufficient in reducing an increase in particulate and molecular contamination due to misunderstandings and mischaracterizations of what occurs near the wafer surface.

In embodiments, the system 100 may still include one or more fixed sensors 502. However, the fixed sensors 502 alone do not necessarily provide the entirety of sensor data used by the system 100.

Figure 6:
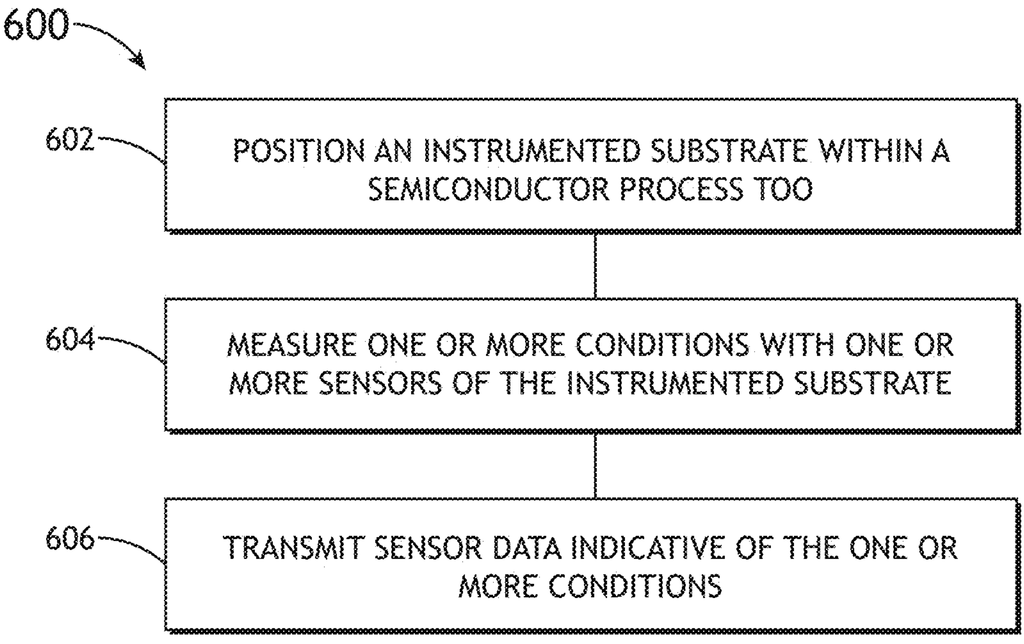
FIG. 6 illustrates a process flow diagram depicting a method for adjusting a focus, in accordance with one or more embodiments of the present disclosure.

FIG. 6 illustrates a process flow diagram depicting a method 600 measuring substrate processing conditions, in accordance with one or more embodiments of the present disclosure. It is noted that the embodiments and enabling technologies described previously herein in the context of the system 100 should be interpreted to extend to the method 600. It is further noted herein that the steps of method 600 may be implemented all or in part by system 100 and/or the instrumented substrate 110. It is further recognized, however, that the method 600 is not limited to the system 100 or instrumented substrate 110 in that additional or alternative system-level embodiments may carry out all or part of the steps of method 600.

In step 602, an instrumented substrate 110 is positioned within a semiconductor process tool 300. For example, the instrumented substrate 110 may be placed by one or more substrate handlers 320, and moved from location to location within the semiconductor process tool 300.

In an optional step, substrate-processing operations are activated and performed using an instrumented substrate 110. For example, the substrate-processing operations may be configured to simulate at least some aspects of (production) substrate processing operations. For instance, the substrate-processing operations may include, but are not necessarily limited to, activating (e.g., directing electrical power to) one or more activatable components 302, 304, 320 of a tool. For example, the substrate-processing operations may include using one or more substrate handlers 320 configured to move the instrumented substrate 110 to multiple locations, including between chambers 312, 314. For example, the substrate-processing operations may include turning on activatable components 302, 304 such as purging components (e.g., components configured to generate and/or reduce air flow such as air pumps and vacuum components 308), processing components (e.g., deposition components), and/or the like. Note that activating a component does not necessarily mean that all functions of the component are used. For example, computing processors, translating components, lights, some moving components, and/or the like may be activated but the entirety of some functionalities such as actually depositing layers and/or etching layers may be configured to not be activated. In this way, the instrumented substrate 110 is not necessarily structurally altered. In other words, layers are not necessarily fabricated on the instrumented substrate 110. In this way, the substrate-processing operations may exclude permanently adding additional layers to the instrumented substrate via deposition and etching operations. However, as noted, one or more non-structurally-altering operations may be activated to more closely simulate processing conditions. When one or more structurally-altering steps are excluded, then such remaining steps may be, but are not required to be, referred to as pseudo-processing operations or non-structurally-altering operations. For instance, a controller 322 of a tool 300 (e.g., tool configured for deposition) may be configured to exclude one or more structurally-altering operations. In embodiments, non-structurally-altering operations may include other steps such as scanning the substrate.

In embodiments, substrate-processing operations (e.g., pseudo substrate-processing operations) include at least allowing a flow of gas through an open channel 104 of the instrumented substrate 110. For example, operations may cause a change in air pressure or air velocity conditions measuring small amounts of gas particle movement in at least one channel 104. For example, the movement of the instrumented substrate 110 or an operation of a component such as an air pump may cause slight differences in gas movement in the chamber 312, 314 that are measurable using the channels 104. Different amounts of air pressure and/or air velocity may be correlated to different amounts of contamination or the like experienced by the instrumented substrate 110.

In step 604, sensor data is measured using one or more sensors 112 of the instrumented substrate 110. The sensors 112 may be configured to measure conditions and generate the sensor data corresponding to the conditions. For example, the sensors 112 may be specialized sensors adapted to measure one or more parameters such as air velocity, air pressure, humidity, etc. The sensor data may correspond to the conditions experienced by the instrumented substrate 110. Further, some parameters/conditions may be measured at or near the surface 202, such as using the channels 104 and openings 212 shown in FIG. 2.

In step 606, the sensor data indicative of the one or more conditions is transmitted to a controller 322 of the semiconductor process tool 300. For example, the controller 102 may be configured to transmit the sensor data to the controller 322 and/or any intermediary controllers, devices, and/or networks, and/or the like. For example, a transmission may be directed to be transmitted. For instance, a controller 102 inside the instrumented substrate 110 may have instructions stored on memory (not shown) and configured to transmit a wireless or wired transmission indicative of (e.g., containing and/or derived from) the conditions. In this way, the sensor data may be transmitted to one or more other components or systems to be used for one or more purposes. For example, the controller 102 may be communicatively coupled to-and configured to direct a transmission to-the controller 322 of the tool 300.

An optional step may include adjusting a parameter based on the sensor data. The system 100 may include a semiconductor process tool 300. For example, a semiconductor process tool 300 may receive the transmission and the semiconductor process tool 300 may be configured to adjust a process condition based on the transmission. For instance, the transmission may be used to adjust a parameter of the semiconductor process tool 300. For instance, a parameter may be adjusted for a filter, air pump, air vacuum, processing component 304, and/or the like. The adjustment may provide a variety of benefits such as improving yields. For example, if the air pressure measured near the surface 202 of the instrumented substrate 110 is above a threshold value, the system 100 may be configured to decrease the air pressure. For instance, a vacuum pump parameter may be adjusted. Such adjusted parameters of the system 100 may include, but are not necessarily limited to: a timing, an electrical activation or deactivated of a component, a target magnitude of a sensor value (e.g., target air pressure reading), a re-ordering of processing steps, a change in a number of processing steps performed, and/or the like.

An optional step may include using an instrumented substrate 110 that is selected from a catalog of instrumented substrates 110. For example, a set of mechanical instrumented substrate 110 may be used for measuring various types of measurements. The catalog may include at least one of, but is not necessarily limited to, an air pressure and air velocity instrumented substrate 110 configured to measure both air pressure and air velocity, a temperature instrumented substrate 110 configured to measure temperature, an ultraviolet (UV) instrumented substrate 110 configured to measure UV light, and a vibration instrumented substrate 110 including accelerometers configured to measure vibrations. For example, the catalog may include at least two of the above listed instrumented substrates 110. For example, the catalog may include all of the above listed instrumented substrates 110. The controller 322 of the tool 300 may be configured to measure conditions based on multiple cataloged instrumented substrates 110 in sequence.

An optional step may include preventative maintenance based on sensor data. For example, the method or the controller 322 may be further configured for performing a preventative maintenance determination based on the sensor data. For example, if the pressure readings creep upwards over time over a threshold value, the controller 322 may be configured to transmit one or more signals that includes an alert indicative of a need to perform maintenance based on the sensor data. The threshold may be set at a value before the processing conditions fall out of specification.

An optional step may include characterizing a tool 300 based on sensor data. For example, a new prototype tool may be characterized using one or more instrumented substrates 110.

Referring again to FIGS. 1 and 2, various components are described in greater detail in accordance with one or more embodiments of the present disclosure.

Similar to controller 322 of FIG. 3, the controller 102 of FIG. 1 may include one or more processors (not shown) and a memory device (not shown), or memory. Such one or more processors and memory of controller 102 may include any limitations of processors 326 and memory 324, respectively, of FIG. 3. For example, the one or more processors may be configured to execute a set of program instructions maintained in the memory. For example, the program instructions may be configured to cause the controller 102 to be configured to measure the sensor data from the sensors 112 and/or transmit one or more signals based on the sensor data. The controllers 102, 322 may be configured to communicate with each other wirelessly or via wired communication.

The one or more processors 326 of the controller 322 may include any processor or processing element known in the art. For the purposes of the present disclosure, the term "processor" or "processing element" may be broadly defined to encompass any device having one or more processing or logic elements (e.g., one or more micro-processor devices, one or more application specific integrated circuit (ASIC) devices, one or more field programmable gate arrays (FPGAs), or one or more digital signal processors (DSPs)). In this sense, the one or more processors 326 may include any device configured to execute algorithms and/or instructions (e.g., program instructions stored in memory). In embodiments, the one or more processors 326 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 322 may include one or more controllers housed in a common housing or within multiple housings. In this way, any controller or combination of controllers may be separately packaged as a module suitable for integration into system 100. Further, the controller 322 may analyze or otherwise process data received from the one or more sensors 112 and feed the data to additional components within the system 100 or external to the system 100.

Further, the memory device 324 may include any storage medium known in the art suitable for storing program instructions executable by the associated one or more processors 326. For example, the memory device 324 may include a non-transitory memory medium. As an additional example, the memory device 324 may include, but is not limited to, a read-only memory, a random-access memory, a magnetic or optical memory device (e.g., disk), a magnetic tape, a solid-state drive and the like. It is further noted that memory device 324 may be housed in a common controller housing with the one or more processors 326.

In this regard, the controller 322 may execute any of various processing steps.

Referring again to FIG. 3, it is noted herein that the one or more components of system 100 may be communicatively coupled to the various other components of system 100 in any manner known in the art. For example, the one or more processors 326 may be communicatively coupled to each other and other components via a wireline (e.g., copper wire, fiber optic cable, and the like) or wireless connection (e.g., RF coupling, IR coupling, WiMax, Bluetooth, 3G, 4G, 4G LTE, 5G, and the like). By way of another example, the controller 322 may be communicatively coupled to one or more components of tool 300 via any wireline or wireless connection known in the art.

In embodiments, the one or more processors 326 may include any one or more processing elements known in the art. In this sense, the one or more processors 326 may include any microprocessor-type device configured to execute software algorithms and/or instructions. In embodiments, the one or more processors 326 may consist of a desktop computer, mainframe computer system, workstation, image computer, parallel processor, or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. Furthermore, it should be recognized that the steps described throughout the present disclosure may be carried out on any one or more of the one or more processors 326. In general, the term "processor" may be broadly defined to encompass any device having one or more processing elements, which execute program instructions from memory 324. Moreover, different subsystems of the system 100 may include processor or logic elements suitable for carrying out at least a portion of the steps described throughout the present disclosure. Therefore, the above description should not be interpreted as a limitation on the present disclosure but merely an illustration.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

We claim:

1. An instrumented substrate comprising:

a substrate body;

one or more sensors coupled to the substrate body and configured to measure one or more conditions of at least one of the substrate body or of an external environment proximate to a surface of the substrate body; and a controller communicatively coupled to the one or more sensors and configured to:

measure sensor data from the one or more sensors indicative of the measured one or more conditions; and transmit the sensor data indicative of the one or more conditions to a controller of a semiconductor process tool, wherein the substrate body comprises one or more sets of a plurality of channels within the substrate body, wherein the one or more sensors comprises a first sensor, the one or more sets of the plurality of channels comprises a first set of channels, and the first sensor is connected to the first set of channels, wherein each channel of the first set of channels comprises an open channel configured to allow a flow of gas through the open channel, wherein each channel of the first set of channels is coupled to an opening defined by the surface of the substrate body and fluidically connected to the external environment proximate to the surface of the substrate body, wherein the first sensor comprises a plurality of ports, each port coupled to a respective channel of the first set of channels, and wherein the first sensor is configured to measure a separate condition at each port, wherein the first set of channels comprise a first channel, a second channel and a third channel, wherein the first channel extends in a first direction, the second channel extends in a second direction, and a third channel extends in a third direction, wherein each of the first direction, second direction, and third direction are not parallel to each other.

2. The instrumented substrate of claim 1, wherein the one or more sensors are located inside the substrate body.

3. The instrumented substrate of claim 1, further comprising a second sensor.

4. The instrumented substrate of claim 3, wherein the second sensor comprises at least one of an air velocity sensor or an air pressure sensor.

5. The instrumented substrate of claim 1, wherein the first sensor comprises an air pressure sensor.

6. The instrumented substrate of claim 5, wherein the substrate body comprises an enclosed pressure reference reservoir coupled to the air pressure sensor.

7. The instrumented substrate of claim 1, wherein the first sensor comprises an air velocity sensor.

8. The instrumented substrate of claim 1, wherein the surface comprises at least one of a top surface or bottom surface.

9. A system comprising:

A semiconductor process tool; and

An instrumented substrate comprising:

a substrate body;

one or more sensors coupled to the substrate body and configured to measure one or more conditions of at least one of the substrate body or of an external environment proximate to a surface of the substrate body; and a controller communicatively coupled to the one or more sensors and configured to:

measure sensor data from the one or more sensors indicative of the measured one or more conditions; and transmit the sensor data indicative of the one or more conditions to a controller of a semiconductor process tool, wherein the substrate body comprises one or more sets of a plurality of channels within the substrate body, wherein the one or more sensors comprises a first sensor, channels of the one or more sets of the plurality of channels comprises a first set of channels, and the first sensor is connected to the first set of channels, wherein each channel of the first set of channels comprises an open channel configured to allow a flow of gas through the open channel, wherein each channel of the first set of channels is coupled to an opening defined by the surface of the substrate body and fluidically connected to the external environment proximate to the surface of the substrate body, wherein the first sensor comprises a plurality of ports, each port coupled to a respective channel of the first set of channels, and wherein the first sensor is configured to measure a separate condition at each port, wherein the first set of channels comprise a first channel, a second channel and a third channel, wherein the first channel extends in a first direction, the second channel extends in a second direction, and a third channel extends in a third direction, wherein each of the first direction, second direction, and third direction are not parallel to each other.

10. The system of claim 9, wherein the one or more sensors are located inside the substrate body.

11. The system of claim 9, further comprising a second sensor.

12. The system of claim 11, wherein the second sensor comprises at least one of an air velocity sensor or an air pressure sensor.

13. The system of claim 9, wherein the first sensor comprises an air pressure sensor.

14. The system of claim 13, wherein the substrate body comprises an enclosed pressure reference reservoir coupled to the air pressure sensor.

15. The system of claim 9, wherein the first sensor comprises an air velocity sensor.

16. The system of claim 9, wherein a controller of the semiconductor process tool is configured to perform substrate-processing operations configured to simulate at least some aspects of production substrate processing operations but wherein the substrate-processing operations exclude permanently adding additional layers to the instrumented substrate via deposition and etching operations.

17. The system of claim 9, wherein a controller of the semiconductor process tool is configured to adjust a process condition based on the sensor data.

18. The system of claim 9, wherein the surface comprises at least one of a top surface or bottom surface.

19. A method for measuring substrate processing conditions comprising:

positioning an instrumented wafer within a semiconductor process tool;

measuring, with one or more sensors, one or more conditions of at least one of a substrate body of an instrumented wafer or an external environment proximate to a surface of the substrate body, wherein the one or more sensors are coupled to the substrate body; and transmitting sensor data indicative of the one or more conditions to a controller of the semiconductor process tool, wherein the substrate body comprises one or more sets of a plurality of channels within the substrate body, wherein the one or more sensors comprises a first sensor, the one or more sets of the plurality of channels comprises a first set of channels, and the first sensor is connected to the first set of channels, wherein each channel of the one or more sets of the plurality of channels comprises an open channel configured to allow a flow of gas through the open channel, wherein each channel of the first set of channels is coupled to an opening defined by the surface of the substrate body and fluidically connected to the external environment proximate to the surface of the substrate body, wherein the first sensor comprises a plurality of ports, each port coupled to a respective channel of the first set of channels, and wherein the first sensor is configured to measure a separate condition at each port, wherein the first set of channels comprise a first channel, a second channel and a third channel, wherein the first channel extends in a first direction, the second channel extends in a second direction, and a third channel extends in a third direction, wherein each of the first direction, second direction, and third direction are not parallel to each other.

20. The method of claim 19, further comprising activating substrate-processing operations, wherein the substrate-processing operations are configured to simulate at least some aspects of production substrate-processing operations but wherein the substrate-processing operations exclude permanently adding additional layers to the instrumented substrate via deposition and etching operations, wherein the substrate-processing operations comprise at least allowing a flow of gas through an open channel of the instrumented substrate.

21. The method of claim 19, wherein the one or more sensors are located inside the substrate body.

22. The method of claim 19, wherein the instrumented substrate further comprises a second sensor.

23. The method of claim 22, wherein the second sensor comprises at least one of an air velocity sensor or an air pressure sensor.

24. The method of claim 19, wherein the first sensor comprises an air pressure sensor.

25. The method of claim 19, wherein the instrumented substrate further comprises an accelerometer.

26. The method of claim 19, further comprising adjusting a process condition based on the sensor data.

27. The method of claim 19, wherein the surface comprises at least one of a top surface or bottom surface.

* * * * *